United States Patent [19]
Graeve et al.

[11] Patent Number: 6,128,754
[45] Date of Patent: *Oct. 3, 2000

[54] TESTER HAVING EVENT GENERATION CIRCUIT FOR ACQUIRING WAVEFORM BY SUPPLYING STROBE EVENTS FOR WAVEFORM ACQUISITION RATHER THAN USING STROBE EVENTS SPECIFIED BY THE TEST PROGRAM

[75] Inventors: Egbert Graeve, Los Altos; Burnell G. West, Fremont, both of Calif.

[73] Assignee: Schlumberger Technologies, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/977,649

[22] Filed: Nov. 24, 1997

[51] Int. Cl.$^7$ ........................................ G06F 11/273
[52] U.S. Cl. ................. 714/39; 714/739; 714/32
[58] Field of Search .................. 368/119; 714/724, 714/39, 741, 30, 32, 736; 324/158.1; 364/264.3; 348/657; 123/456

[56] References Cited

U.S. PATENT DOCUMENTS

| | | | |
|---|---|---|---|
| 4,497,056 | 1/1985 | Sugamori | 714/736 |
| 4,678,345 | 7/1987 | Agoston | 368/119 |
| 4,723,158 | 2/1988 | White | 348/657 |
| 5,212,443 | 5/1993 | West et al. | 714/724 |
| 5,477,139 | 12/1995 | West et al. | 123/456 |
| 5,583,430 | 12/1996 | Dinteman | 324/158.1 |
| 5,673,275 | 9/1997 | Garcia et al. | 714/724 |

OTHER PUBLICATIONS

"Logic Waveform Utility", Trillium Test Systems Applications, Note, by Robert Huston dated Feb. 4, 1986, pp. 1–17.

*Primary Examiner*—Albert De Cady
*Assistant Examiner*—David Ton
*Attorney, Agent, or Firm*—Fish & Richardson P.C.

[57] ABSTRACT

In a tester for testing circuits, apparatus and methods for acquiring waveform data from a circuit under test. While a test program is being run by the tester, waveform acquisition strobe events are generated for application to a terminal of a circuit under test. A measurement circuit receives the waveform acquisition strobe events and applies each strobe event to the terminal of the circuit and generates result signals representing the result of applying the strobe events to the terminal. A capture memory receives and stores result signals generated by the measurement circuit.

34 Claims, 2 Drawing Sheets

TESTER HAVING EVENT GENERATION CIRCUIT FOR ACQUIRING WAVEFORM BY SUPPLYING STROBE EVENTS FOR WAVEFORM ACQUISITION RATHER THAN USING STROBE EVENTS SPECIFIED BY THE TEST PROGRAM

BACKGROUND

The present invention relates to automatic test equipment ("ATE") testers for testing circuits, such as testers for testing integrated circuits. Some such testers have a processor-per-pin architecture, as described, for example, in commonly-owned U.S. Pat. Nos. 5,212,443 and 5,673,275, the disclosures of which are incorporated by reference.

In a processor-per-pin architecture, a tester has local sequencers, each of which is programmable to apply events to a terminal of a circuit under test, generally referred to as a pin of a device under test (a "DUT"). In a tester of this kind, each local sequencer generates events with reference to a global clock and other global signals. Characteristically, each local sequencer is individually programmable so that different local sequencers can provide different events during the same test period.

Generally, events are of one of two event types: drive events drive the pin to a particular state, and strobe events (also called test events) test the state of the pin. For example, a test-for-high event (which may be denoted "T1") is a strobe event that generates a logical pass-fail value indicating whether the voltage at the pin is above a threshold value that defines a high state (that is, that defines a "1"). The event time of an event specifies when the event is to occur. For a strobe event, the event may occur over a time window, testing whether the state occurs at any time in the window, or it may be an edge event, testing the state at a particular time.

SUMMARY

In general, in one aspect, the invention features, in a tester for testing circuits, apparatus for acquiring waveform data from a circuit under test. The apparatus includes an event generation circuit that is operable to a supply drive events and strobe events for application to a terminal of a circuit under test. The event generation circuit has a normal mode of operation and a waveform acquisition mode of operation. In the normal mode of operation, the event generation circuit supplies both drive events and strobe events according to a test program; in the waveform acquisition mode of operation, the event generation circuit supplies drive events according to the test program and strobe events for waveform acquisition rather than strobe events specified by the test program.

Preferred embodiments of the invention include one or more of the following features. The apparatus includes a capture memory for storing strobe result signals and a measurement circuit that is operable to apply a strobe event to the terminal of the circuit under test to produce a strobe result signal. The measurement circuit is coupled to receive strobe events from the event generation circuit and coupled to communicate strobe result signals to the capture memory for storage. The measurement circuit is coupled to communicate strobe result signals to the capture memory through an error correlation circuit, which in a normal mode of operation correlates strobe result signals with test program vectors and in a waveform acquisition mode of operation provides strobe result signals to the capture memory without correlation to test program vectors. The event generation circuit supplies strobe events each having an event time; and the measurement circuit is configured to receive a comparator signal from a pin electronics circuit connected to the terminal of the circuit under test. The measurement circuit is operable to apply a received strobe event at its event time to the comparator signal to generate a corresponding strobe result signal. The event generation circuit operating in waveform acquisition mode obtains an acquisition offset value from a programmable register to determine an event time for a strobe event. The comparator signal includes an above-comparator-high signal and a below-comparator-low signal, and the value of a strobe result signal corresponding to a received strobe event is determined by whether the value of the above-comparator-high signal or of the below-comparator-low signal satisfies the event type of the received strobe event. The signal above-comparator-high is asserted by the pin electronics circuit when the voltage at the terminal of the circuit under test is above a high threshold value, and the signal below-comparator-low is asserted by the pin electronics circuit when the voltage at the terminal of the circuit under test is below a low threshold value. The high threshold value and the low threshold value are independently programmable values stored in the tester. The high threshold value and the low threshold value are each independently programmable for each terminal of a circuit under test.

The event generation circuit may include a test program strobe event generator and a waveform acquisition strobe event generator, each connected to supply strobe events to a selector circuit controlled by a waveform acquisition mode signal. The test program strobe event generator is operable to generate strobe events as specified by a test program, and the waveform acquisition strobe event generator is operable to generate strobe events for waveform acquisition, so that the event generation circuit supplies either test program strobe events or strobe events for waveform acquisition according to the state of the waveform acquisition mode signal. The strobe events for waveform acquisition are generated at a maximum rate independent of a test period rate of the test program.

The tester may include a second event generation circuit that is operable to supply drive events and strobe events for application to the terminal of the circuit under test, the second event generation circuit having a waveform acquisition mode of operation in which the second event generation circuit supplies strobe events for waveform acquisition rather than strobe events specified by the test program.

The tester may include the apparatus for acquiring waveform data reproduced for each of a plurality of terminals of a circuit under test.

The tester may include a plurality of event generation circuits coupled to supply drive events and strobe events for application to one terminal of the circuit under test, each of the plurality of event generation circuits having a waveform acquisition mode of operation in which the event generation circuit supplies strobe events for waveform acquisition rather than strobe events specified by the test program. The plurality of event generation circuits may include four event generation circuits. The plurality of event generation circuits supplying strobe events to the terminal operate together in waveform acquisition mode to supply a stream of strobe events for waveform acquisition in a regularly repeating pattern. The plurality of event generation circuits supplying strobe events to the terminal operate together in waveform acquisition mode to supply a stream of strobe events having alternating event types test-for-high and test-for-low.

The tester may include a plurality of local sequencers in a processor-per-pin architecture, each of the local sequencers including an event generation circuit operable to supply drive events and strobe events for application to a terminal of a circuit under test corresponding to the local sequencer, each of the event generation circuits having a waveform acquisition mode of operation.

In general, in another aspect, the invention provides a method of running a programmable tester to acquire waveform data from a circuit. The method includes running a test program in the tester, the test program specifying drive events and test program strobe events to be applied to terminals of a circuit under test. During a waveform acquisition period occurring while the test program is running, the method generates waveform acquisition strobe events for waveform acquisition and applies the waveform acquisition strobe events to a first terminal of the circuit under test rather than strobe events specified by the test program for the first terminal. The method also includes collecting in a first memory result signals resulting from the application of the waveform acquisition strobe events to the first terminal, the result signals representing a waveform acquired from the circuit under test.

Preferred embodiments of the invention include one or more of the following features. The test program specifies drive events and strobe events to be applied to a second terminal of the circuit under test; and the method further includes generating and applying strobe events to the second terminal as specified by the test program while generating and applying strobe events for waveform acquisition to the first terminal, and collecting, in a second memory, result signals resulting from the application of test program strobe events to the second terminal while collecting in the first memory result signals resulting from the strobe events for waveform acquisition. Each waveform acquisition strobe event has an event time that is a sum of values including a sweep offset value, all waveform acquisition strobe events generated during the waveform acquisition period being generated with an event time calculated using the same sweep offset value. The method may further include running the test program multiple times, each time with the generation of waveform acquisition strobe events during a waveform acquisition period, each time with a different sweep offset value, the generation of waveform acquisition strobe events occurring at a time synchronized across the multiple runnings of the test program, whereby waveform acquisition strobe event result signals from the multiple runnings of the test program are produced that may be combined to provide a signal of increased time resolution representing a waveform acquired from the circuit under test. Each waveform acquisition strobe event tests a state of the first terminal against a threshold value.

The method may further include running the test program multiple times, each time with the generation of waveform acquisition strobe events during a waveform acquisition period, each time with a different threshold value being used to test the state of the terminal with the waveform acquisition strobe events, the generation of waveform acquisition strobe events occurring at a time synchronized across the multiple runnings of the test program, whereby waveform acquisition strobe event result signals from the multiple runnings of the test program are produced that may be combined to provide a signal of increased voltage resolution representing a waveform acquired from the circuit under test.

The method may further include running the test program multiple times, each time with the generation of waveform acquisition strobe events during a waveform acquisition period, each time with a different combination of threshold value and sweep offset value, the threshold value being used to test the state of the terminal and the sweep offset value being included in the event times of the waveform acquisition strobe events, the generation of waveform acquisition strobe events occurring at a time synchronized across the multiple runnings of the test program, whereby waveform acquisition strobe event result signals from the multiple runnings of the test program are produced that may be combined to provide a signal of increased voltage resolution and increased time resolution representing a waveform acquired from the circuit under test.

In general, in another aspect, the invention provides, in a tester for testing circuits, apparatus for acquiring waveform data from a circuit under test. The apparatus includes an acquire event generation circuit coupled to supply strobe events for application to a terminal of a circuit under test. The acquire event generation circuit is operable to generate a stream of strobe events for waveform acquisition while the tester is running a test program generating drive events for application to the circuit under test. A measurement circuit is coupled to receive the stream of strobe events from the acquire event generation circuit and is operable to apply each strobe event of the stream to the terminal of the circuit under test and to generate a stream of result signals representing the result of applying the strobe events to the terminal. A capture memory is coupled to the measurement circuit and operable to receive and store result signals generated by the measurement circuit.

Preferred embodiments of the invention include one or more of the following features. The acquire event generation circuit is configured to obtain an acquisition offset value from a programmable register to determine an event time for a strobe event. The strobe events for waveform acquisition are generated at a maximum rate independent of a test period rate of the test program. The apparatus is reproduced for each of a plurality of terminals of a circuit under test The tester includes a plurality of acquire event generation circuits each coupled to be coupled to the same terminal of a circuit under test. The plurality of acquire event generation circuits are operable to supply a single stream of strobe events for waveform acquisition to one terminal of a circuit under test.

Among the advantages of the invention are one or more of the following. Logic waveform acquisition can be programmed to acquire two-state or three-state data. With thresholds set at different levels for test-for-high and test-for-low events, three-state waveform data provides an indication of driver output in the presence of reflections in a source-terminated line. Waveforms may be acquired simultaneously from one, some, or all of the pins of a device under test. Waveform acquisition does not interfere with the drive side of a test program. Waveform acquisition may begin at a program-selected vector in a test program. Applying calibration data to waveform acquisition strobe events allows the events to be placed accurately. Waveform data can be used for debugging a test program or a device design. When multiple acquisition sweeps are run to achieve higher voltage or time resolution, partial results can be provided to a user. Waveform acquisition can be applied to pins of a device under test, obtaining the waveform which the pin electronics driver applies to the pin. This means that a tester can get both input and output signals from a single pin or multiple pins of a device under test over the same acquisition time, thereby providing a full picture of what is happening with the device.

Other features and advantages of the invention will become apparent from the following description and from the claims.

DETAILED DESCRIPTION

Figure 1:
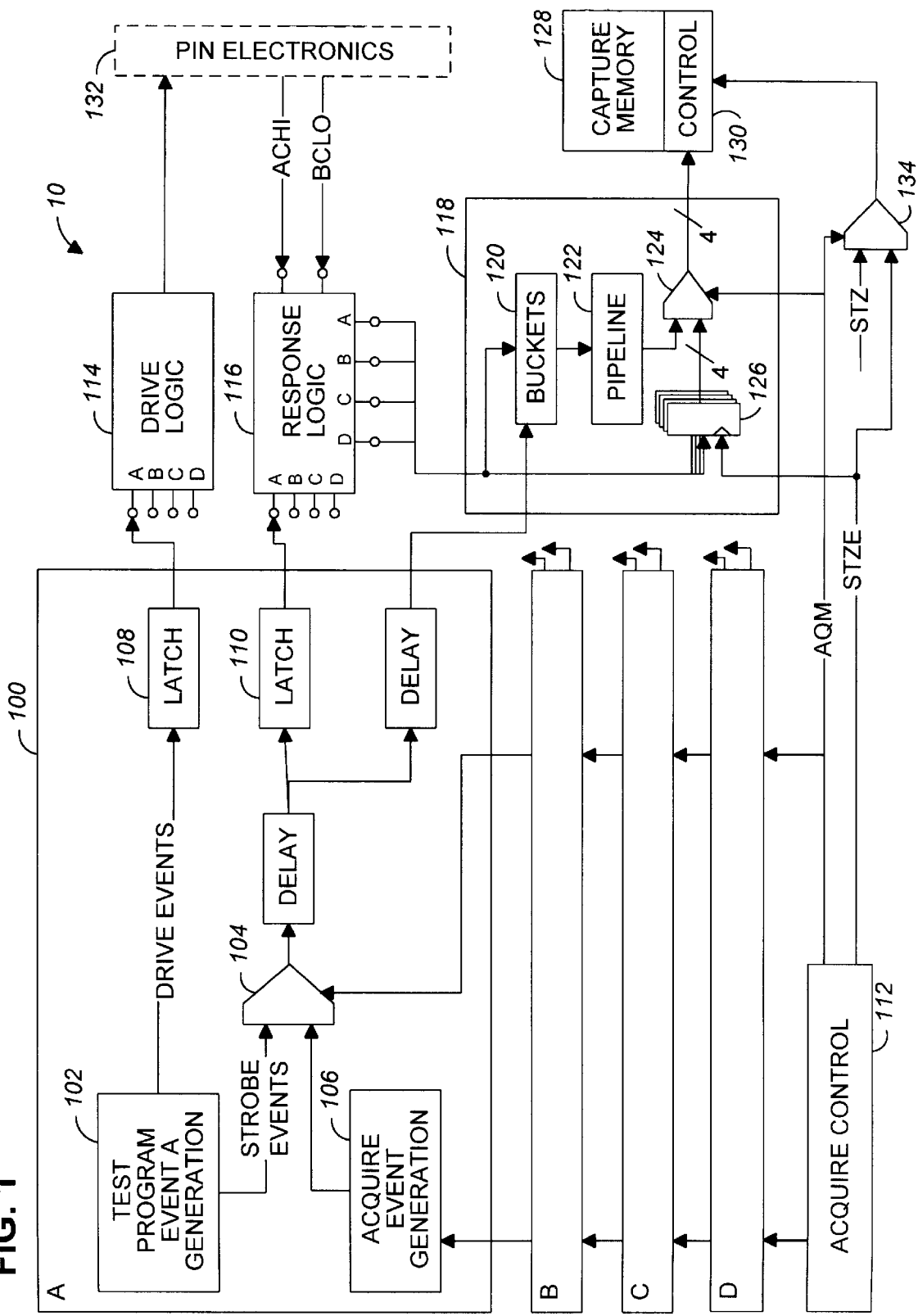
FIG. 1 is a logical block diagram of elements of a local sequencer according to the invention.

Referring to FIG. 1, a tester for testing circuits has a local sequencer 10 according to the present invention. The tester has a processor-per-pin architecture, as described in U.S. Pat. No. 5,212,443, and the local sequencer is replicated for each of the anticipated number of pins of the devices to be tested by the tester. When the tester is running a test program, the local sequencer generates events as specified by the test program. The local sequencer advantageously has multiple event sequencers 100 to generate events. The local sequencer illustrated has four event sequencers A, B, C, and D. Each event sequencer has an event generation circuit including test program event generation circuit 102 and acquire event generation circuit 106. Test program event generation circuit 102 generates drive events and strobe events, as specified by a test program. The test program event generation circuit 102 provides drive events having an elementary event type and an event time through a latch 108 to a drive logic circuit 114. Similarly, the test program event generation circuit 102 provides strobe events having an elementary event type and an event time through a latch 110 to a response logic circuit 116. Strobe events are delayed before being transmitted to response logic 116 to make allowance for the time that signals require to go to the device under test and back.

Figure 3:
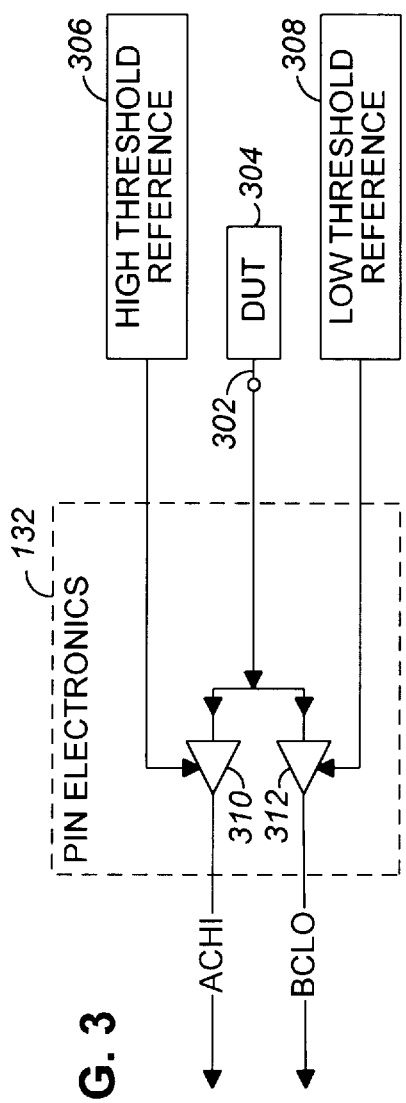
FIG. 3 is a logical block diagram illustrating elements of tester pin electronics relevant to the invention.

Drive logic 114 and response logic 116 respectively provide drive signals to, and receive response signals from, the pin electronics 132 for a particular pin 302 of a device under test 304 (FIG. 3). The pin electronics 132 are generally connected to the local sequencer 10 by coaxial cable. On the strobe side, the pin electronics provide two signals from two comparators 310 and 312: ACHI (above comparator high) is asserted when the voltage level of the pin is above a previously-programmed high threshold value (provided by reference signal 306); BCLO (below comparator low) is asserted when the voltage level of the pin is below a previously-programmed low threshold value (provided by reference signal 308). The high and low threshold values may be the same or different values, and the values may be different for different pins. The high threshold value may be below the low threshold value.

In normal operation, response logic 116 applies strobe events to the comparator signals from the pin electronics 132 to provide pass-fail result signals to a bucketing circuit 120 and a pipeline circuit 122 in an error correlator 118. The local sequencer 10 may store pass-fail signals in a capture memory 128.

Local sequencer 10 is enhanced to provide a waveform acquisition mode of operation as will now be described. In waveform acquisition mode, automatically generated strobe events are used to the exclusion of strobe events specified by a test program. Acquire control circuit 112 responds to global control signals to assert a waveform acquisition mode signal AQM and to generate a waveform acquisition clock signal STZE. When AQM is not asserted, strobe events specified by the test program are routed through latch 110.

When AQM is asserted, selector 104 selects the logic acquisition events output by an acquire event generation circuit 106 and routes them through latch 110 to response logic 116. In the illustrated embodiment, each of the four event sequencers A, B, C, and D are substantially identical to the illustrated event sequencer A, and each has an acquire event generation circuit 106. The four acquire event generation circuits are referred to as acquire event generation circuits A, B, C, and D when they must be distinguished.

Acquire event generation circuit 106 generates strobe events for waveform acquisition at a rate independent of the test rate of test program. It is advantageous to generate waveform acquisition events at the highest possible rate. If the highest rate for the event sequencers is 5 nanoseconds (ns), the strobe events are placed so that the time between them is 1.25 ns. Because the acquisition event rate is independent of the test program period, acquisition control circuit 112 generates acquisition clock signal STZE to run at the acquisition event rate. Signal STZE is used, as will be described later, in place of a signal STZ that is normally used to define the test period boundary for strobe events.

In the illustrated embodiment, acquire event generation circuits A and C generate T0 (test-for-low) strobe events, and acquire event generation circuits B and D generate T1 (test-for-high) strobe events. In preparation for a local sequencer entering waveform acquisition mode, the tester sets an edge mode flag for the local sequencer causing the response logic 116 to generate edge strobes (rather than window strobes) in response to strobe events during waveform acquisition. Thus, the strobe events generated by the acquire event generation circuits 106 test the state of the terminal at the event time (rather than over a time window).

All four event sequencers receive a global clock signal CLK originating from a global sequencer and having a nominal period of 2.5 ns. Each event generated by an acquire event generation circuit 106 is generated at an event time defined as an offset from a reference edge of the basic clock CLK. The reference edge for each acquire event generation circuit comes once every other basic clock period, ie., once every 5 ns. When a local sequencer enters waveform acquisition mode, acquire event generation circuits C and D begin receiving the basic clock signal one cycle (i.e., 2.5 ns) after acquire event generation circuits A and B do, and so their acquisition strobe events are triggered one clock (i.e., 2.5 ns) after those of acquire event generation circuits A and B.

Figure 2:
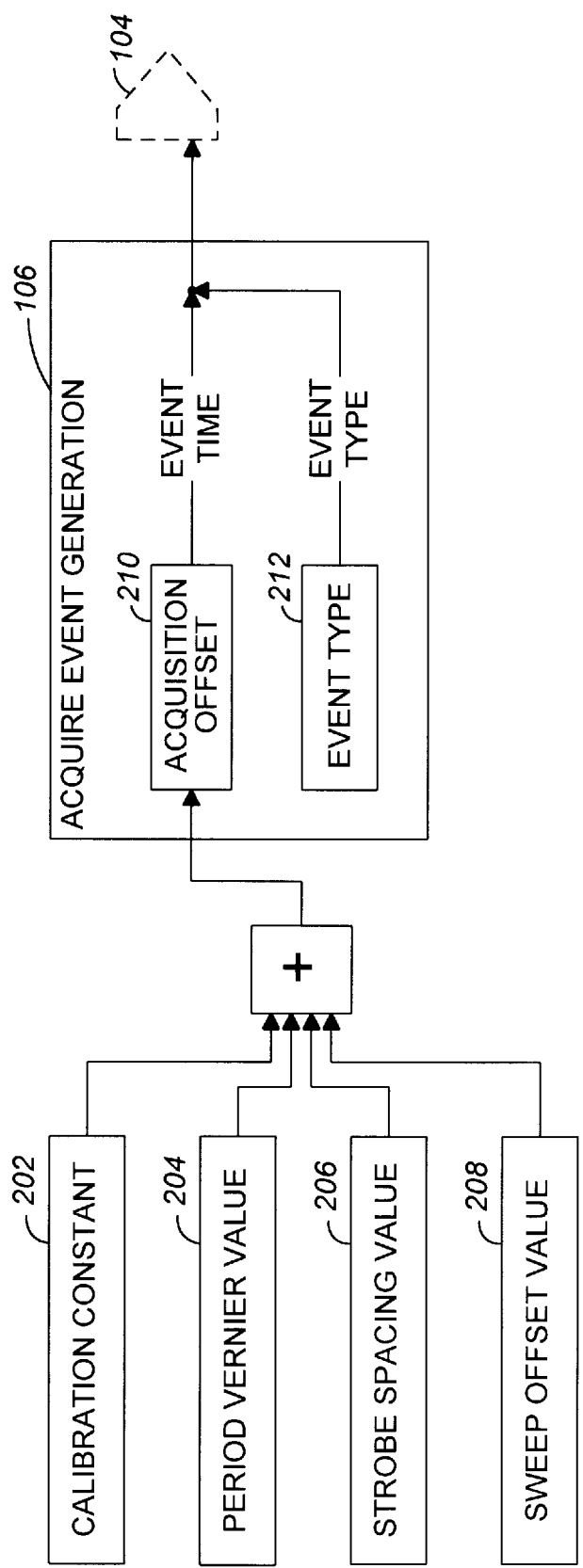
FIG. 2 is a logical block diagram illustrating operation of an acquire event generation circuit according to the invention.

The acquisition offset values used to generated event times are integers representing a whole and fractional number of basic clock periods, the lower 8 bits of the integer representing the fractional part. For a clock having a period of 2.56 ns, the least significant bit of the offset value therefore represents 10 picoseconds (ps). In principle, the acquisition offsets could be calculated on the fly, as suggested by FIG. 2; however, it has been found to be advantageous to pre-calculate the acquisition offset and store it in an acquisition offset register 210 before the test program is initiated. The acquisition offset is generally different for each acquire event generation circuit A-D. The acquisition offset is the sum of (i) the calibration constant 202 for the event sequencer for the type of event (T0 or T1) generated by the acquire event generation circuit; (ii) the period vernier value 204 of the test vector with which acquisition mode begins; and (iii) a strobe spacing value 206 that is set to 0 ns for event sequencers A and C and 1.25 ns for event sequencers B and D.

The calibration constant is an offset that is added to account for the propagation delays for the particular event sequencer and its device pin.

The period vernier value is common to all event sequencers and to all local sequencers beginning waveform acquisition with the same test program test vector. As described in greater detail in U.S. Pat. No. 5,212,443, the period vernier for a test period (ie., for a test vector) defines the beginning of a test period with reference to an edge of the global clock signal CLK. Including the period vernier in the acquisition offset value precisely synchronizes the beginning of acquisition with a particular test period boundary of the test program, so that in repeated runs of the test program, the acquisition will be synchronized with respect to the test period boundary of a reference test vector of the test program.

The acquisition offset value may be thought of as also including a sweep offset value 208, an offset that may be set to a series of values for a series of tests to sweep a waveform to a high resolution. For example, with a basic clock period of 2.56 ns, spacing values of 0 ns for event sequencers A and C and 1.28 ns for event sequencers B and D cause strobes to be generated at 0 ns, 1.28 ns, 2.56 ns, and 3.84 ns (ie., once every 1.28 ns). With a sweep offset value incremented in 10 ps steps from 0 ns to 1.27 ns, a test program could be run 128 times to provide waveform data with a time resolution of 10 ps when high and low thresholds are set to the same value, and 256 times for the same resolution when the thresholds are set to different values.

With four event sequencers in a local sequencer operating as has just been described, the acquisition strobe events from event sequencers A and C will test the signal BCLO generated by the low comparator of pin electronics 132. In response to a T0 event, a logic "1" will generate a fail and a logic "0" will generate a pass. Similarly, acquisition strobe events from event sequencers B and D will test the signal ACHI generated by the high comparator of pin electronics 132. A logic "1" will generate a pass and a logic "0" will generate a fail. The four strobe results of each 5 ns acquisition period are placed in 4 consecutive bits of the capture memory 128. As described above, if finer timing resolution than 1.25 ns is desired, the test program can be run several times, with each run contributing four data points for every 5 ns.

As has been mentioned, in a normal mode of operation, pass-fail result signals from response logic circuit 116 are collected in the error correlator circuit 118. The bucket circuit 120 normally receives pass-fail signals from response logic 116 and strobe event information (delayed to match the pass-fail signals) from the event sequencers. This data is combined in a fail pipeline 122 and may be stored in capture memory 128. The bucket circuit 120 is loaded with the strobe result by a delayed strobe signal, and its contents are transferred to the fail pipeline 122 by the signal STZ. Local sequencers 10 that are not operating in waveform acquisition mode can operate in this way to capture fail data in their capture memories while other local sequencers are operating in waveform acquisition mode and capturing waveform data.

In the waveform acquisition mode of operation, the bucket and pipeline circuits of error correlator 118 are bypassed by the operation of selector 124 and latch circuit 126. When signal AQM is asserted, selector 124 routes signals from latch circuit 126 to the capture memory 128 and blocks those from fail pipeline 122. Latch circuit 126 includes four latches, one for each of the outputs of response logic 116. It receives the pass-fail signals and latches the pass-fail signals from response logic 116 for all four event sequencers. These are routed through selector 124 and stored in capture memory 128, whose control circuitry 130 is clocked by acquisition mode clock signal STZE received through selector 134. Capture memory is 16 bits wide and the four pass-fail result bits of each 5 ns acquisition period are assembled into 16-bit words by control circuit 130 before being stored. Generally, wrap protection will be set for the capture memory 128 to prevent data from being overwritten.

With 16 strobe results stored in the capture memory every 4×5=20 ns as has been described, each succeeding bit pair may be considered as representing a measurement taken at an increment of 2.5 ns from its predecessor. The first bit of each pair will be the result of a T0 event; the second bit, the result of a T1 event. If the high and low thresholds are set at 50%—that is, half way between a logic "0" and a logic "1" at the pin—a logic waveform with a 1.25 ns time resolution can readily be derived from the data by inverting every other bit. If the high and low thresholds are set at different values, such as 75% for high and 25% for low, then three results are generally possible. If the pin voltage is below 25%, T0 will pass and T1 will fail. Similarly, if the pin voltage is above 75%, T0 will fail and T1 will pass. If the pin voltage is between 25% and 75%, both T0 and T1 will fail. Unless the pin voltage crosses one of the thresholds between the T0 and T1 strobes, one of the foregoing three results will occur. If the pin voltage does cross thresholds, any of the foregoing three results may be mimicked, and a fourth result, namely both strobes passing, may occur if the pin voltage changes from "0" to "1" between T0 and T1. A useful interpretation may be achieved by treating a pass-pass result, like a fail-fail result, as a middle, treating a pass-fail result as a low, and treating a fail-pass result as a high. In this way, a three-state logic waveform may be acquired with a time resolution of 2.5 ns in one test program run.

By having alternating T0 and T1 strobes and thresholds set independently for T0 and T1, the test results from waveform acquisition provides information about the driver waveform at the device pin (although the strobe measurements are made at the pin electronics). More important advantages arise when three-state logic acquisition is used in a simultaneous bidirectional signaling test environment. In simultaneous bidirectional signaling, a driver at each end of a line may simultaneously transmit a signal, and the received signal is detected by subtracting the drive signal from the signal on the line. In a simultaneous bidirectional signaling test environment with thresholds set at 25% and 75%, as described above, the waveform recorded at the comparators is high when the driver output is high and the device output is high, middle when the driver output is low and the device output is high or when the driver output is high and the device output is low, and low when the driver output is low and the device output is low. The two middle cases can be easily be distinguished by reference to the test program data for the driver.

By running the test multiple times with varying sweep offset values, the logic waveforms from each test run, whether based on two-state data or three-state data, may readily be combined to provide a waveform of greater time resolution. Similarly, the threshold levels may be varied over a series of tests, to provide waveforms that may be combined to provide a waveform of greater voltage resolution. Finally, both sweep offset and threshold values may be varied over a series of tests to provide the data for a combined final waveform with greater voltage and time resolution.

The tester may be configured so that more than one event sequencer 10 is tied to one pin of a device under test. By tying a second, otherwise unused event sequencer 10 and its pin electronics 132 to a pin, the first event sequencer—the one normally tied to the pin—can run a test program and generate the drive and strobe events of the test program, while the second sequencer is put in waveform acquisition mode, as has been described, enabling the user to obtain both test results and waveform data simultaneously for a single pin. Because each event sequencer 10 begins acquisition precisely in a selected vector when acquisition mode is initiated, the technique of tying a second event sequencer to a pin can be extended to tying further event sequencers to a pin, by which the time resolution, voltage resolution, or both of a single test run may be increased by taking data in parallel with different sweep offset values, different thresholds, or both. In addition, with multiple event sequencers tied to a single pin, the maximum time duration of waveform acquisition may be extended by initiating acquisition mode in the event sequencers serially.

Other embodiments are within the scope of the following claims. For example, the acquisition strobe event types can be the same for all acquisition strobe events. The number of events in an acquisition period can be greater or less than four. The acquisition period can be longer or shorter than 5 ns. The separation of neighboring events can vary. The spacing values for acquire event generation circuits B and D can be set to less than 1.25 ns (or less than one-fourth the acquisition period) to reduce the likelihood of a transition between acquisition strobes A and B or between acquisition strobes C and D when acquiring three-level waveform data. The acquisition strobe event can be of a type that generates a result signal of more than one bit, such as a result that represents the state of both an above-comparator-high and a below-comparator-low signal, at the event time. The capture memory may have a width greater or less than 16 bits. The number of event generation circuits associated with a terminal of a circuit under test may be greater or less than four.

What is claimed is:

1. In a tester for testing circuits, apparatus for acquiring waveform data from a circuit under test, the apparatus comprising:

an event generation circuit operable to supply drive events and strobe events for application to a terminal of a circuit under test, wherein drive events drive the terminal under test to a particular state and strobe events test the state of the terminal under test, the event generation circuit having a normal mode of operation and a waveform acquisition mode of operation, the event generation circuit operating in the normal mode of operation to supply both drive events and strobe events according to a test program, the event generation circuit operating in the waveform acquisition mode of operation to supply drive events according to the test program and to supply strobe events for waveform acquisition rather than strobe events specified by the test program, the tester having a maximum sustained sampling rate for capturing data in a capture memory and the event generation circuit being operable to supply strobe events for waveform acquisition at programmable event times programmed to a resolution finer than the period of the maximum sustained sampling rate.

2. The apparatus of claim 1, further comprising:

a capture memory for storing strobe result signals; and a measurement circuit operable to apply a strobe event to the terminal of the circuit under test to produce a strobe result signal, the measurement circuit coupled to receive strobe events from the event generation circuit and coupled to communicate strobe result signals to the capture memory for storage.

3. The apparatus of claim 2, wherein:

the measurement circuit is coupled to communicate strobe result signals to the capture memory through an error correlation circuit, the error correlation circuit operating in a normal mode of operation to correlate strobe result signals with test program vectors, the error correlation circuit operating in a waveform acquisition mode of operation to provide strobe result signals to the capture memory without correlation to test program vectors.

4. The apparatus of claim 2, wherein:

the event generation circuit supplies strobe events each having an event time; and the measurement circuit is configured to receive a comparator signal from a pin electronics circuit connected to the terminal of the circuit under test, the measurement circuit being operable to apply a received strobe event at its event time to the comparator signal to generate a corresponding strobe result signal.

5. The apparatus of claim 4, wherein:

the event generation circuit operating in waveform acquisition mode obtains an acquisition offset value from a programmable register to determine an event time for a strobe event.

6. The apparatus of claim 4, wherein:

the comparator signal comprises an above-comparator-high signal and a below-comparator-low signal;

the received strobe event has an event type; and the value of the corresponding strobe result signal is determined by whether the signals above-comparator-high or below-comparator-low satisfy the event type of the received strobe event.

7. The apparatus of claim 6, wherein:

the signal above-comparator-high is set to have a true value by the pin electronics circuit when the voltage at the terminal of the circuit under test is above a high threshold value; and the signal below-comparator-low is set to have a true value by the pin electronics circuit when the voltage at the terminal of the circuit under test is below a low threshold value.

8. The apparatus of claim 7, wherein:

the high threshold value and the low threshold value are independently programmable values stored in the tester.

9. The apparatus of claim 7, wherein:

the high threshold value and the low threshold value are each independently programmable for each terminal of a circuit under test.

10. The apparatus of claim 1, wherein:

the event generation circuit comprises a test program strobe event generator and a waveform acquisition strobe event generator each being connected to supply strobe events to a selector circuit controlled by a waveform acquisition mode signal, the test program strobe event generator being operable to generate strobe events as specified by a test program, and the waveform acquisition strobe event generator being operable to generate strobe events for waveform acquisition, whereby the event generation circuit supplies test program strobe events when the waveform acquisition mode signal is not asserted or strobe events for waveform acquisition when the waveform acquisition mode signal is asserted.

11. The apparatus of claim 1, wherein:
the strobe events for waveform acquisition are generated at a maximum rate independent of a test period rate of the test program.

12. The tester of claim 1 comprising the apparatus of claim 1 reproduced for each of a plurality of terminals of a circuit under test.

13. The tester of claim 1, wherein:
the event generation circuit is one of a plurality of event generation circuits coupled to supply drive events and strobe events for application to one terminal of the circuit under test, each of the plurality of event generation circuits having a waveform acquisition mode of operation in which the event generation circuit supplies strobe events for waveform acquisition rather than strobe events specified by the test program.

14. The tester of claim 13, wherein:
the plurality of event generation circuits includes four event generation circuits.

15. The tester of claim 13, wherein:
the plurality of event generation circuits supplying strobe events to the terminal operate together in waveform acquisition mode to supply a stream of strobe events for waveform acquisition in a regularly repeating pattern.

16. The tester of claim 15, wherein:
the plurality of event generation circuits supplying strobe events to the terminal operate together in waveform acquisition mode to supply a stream of strobe events having alternating event types test-for-high and test-for-low.

17. The tester of claim 1, further comprising:
a plurality of local sequencers in a processor-per-pin architecture, each of the local sequencers comprising an event generation circuit operable to supply drive events and strobe events for application to a terminal of a circuit under test corresponding to the local sequencer, each of the event generation circuits having a waveform acquisition mode of operation in which the event generation circuit supplies strobe events for waveform acquisition rather than strobe events specified by the test program.

18. A method of running a programmable tester to acquire waveform data from a circuit having terminals, the method comprising:
running a test program in the tester, the test program specifying drive events and test program strobe events to be applied to terminals of a circuit under test;
during a waveform acquisition period occurring while the test program is running, generating waveform acquisition strobe events for waveform acquisition and applying the waveform acquisition strobe events to a first terminal of the circuit under test rather than strobe events specified by the test program for the first terminal; and
collecting, in a first memory, result signals resulting from the application of the waveform acquisition strobe events to the first terminal, the result signals representing a waveform acquired from the circuit under test, the first memory having a maximum sustained sampling rate for capturing data and the waveform acquisition strobe events having event times programmed to a resolution finer than the period of the maximum sustained sampling rate.

19. The method of claim 18, wherein the test program further specifies drive events and strobe events to be applied to a second terminal of the circuit under test, the method further comprising:
generating and applying strobe events to the second terminal as specified by the test program while generating and applying strobe events for waveform acquisition to the first terminal; and
collecting, in a second memory, result signals resulting from the application of test program strobe events to the second terminal while collecting in the first memory result signals resulting from the strobe events for waveform acquisition.

20. The method of claim 18, wherein:
each waveform acquisition strobe event has an event time that is a sum of values including a sweep offset value, all waveform acquisition strobe events generated during the waveform acquisition period being generated with an event time calculated using the same sweep offset value.

21. The method of claim 20, further comprising:
running the test program multiple times, each time with the generation of waveform acquisition strobe events during a waveform acquisition period, each time with a different sweep offset value, the generation of waveform acquisition strobe events occurring at a time synchronized across the multiple runnings of the test program, whereby waveform acquisition strobe event result signals from the multiple runnings of the test program are produced that may be combined to provide a signal of increased time resolution representing a waveform acquired from the circuit under test.

22. The method of claim 18, wherein:
each waveform acquisition strobe event tests a state of the first terminal against a threshold value.

23. The method of claim 22, further comprising:
running the test program multiple times, each time with the generation of waveform acquisition strobe events during a waveform acquisition period, each time with a different threshold value being used to test the state of the terminal with the waveform acquisition strobe events, the generation of waveform acquisition strobe events occurring at a time synchronized across the multiple runnings of the test program, whereby waveform acquisition strobe event result signals from the multiple runnings of the test program are produced that may be combined to provide a signal of increased voltage resolution representing a waveform acquired from the circuit under test.

24. The method of claim 22, further comprising:
running the test program multiple times, each time with the generation of waveform acquisition strobe events during a waveform acquisition period, each time with a different combination of threshold value and sweep offset value, the threshold value being used to test the state of the terminal and the sweep offset value being an addend in the calculation of the event times of the waveform acquisition strobe events, the generation of waveform acquisition strobe events occurring at a time synchronized across the multiple runnings of the test program, whereby waveform acquisition strobe event result signals from the multiple runnings of the test program are produced that may be combined to provide a signal of increased voltage resolution and increased time resolution representing a waveform acquired from the circuit under test.

25. The method of claim 22, wherein:
the waveform acquisition strobe events comprise both test-for-high events and test-for-low events; and the threshold value comprises a high threshold value and a low threshold value, the high threshold value being different from the low threshold value, the test-for-high events operating to test the terminal against the high threshold value and the test-for-low events operating to test the terminal against the low threshold value, whereby a test-for-high event combines with a test-for-low event to measure a waveform value of high, middle, or low.

26. In a tester for testing circuits, apparatus for acquiring waveform data from a circuit under test, the apparatus comprising:

an acquire event generation circuit coupled to supply strobe events for application to a terminal of a circuit under test, the acquire event generation circuit being operable to generate a stream of strobe events for waveform acquisition while the tester is running a test program generating drive events for application to the circuit under test;

a measurement circuit coupled to receive the stream of strobe events from the acquire event generation circuit and operable to apply each strobe event of the stream to the terminal of the circuit under test and to generate a stream of result signals representing the result of applying the strobe events to the terminal; and a capture memory coupled to the measurement circuit and operable to receive and store result signals generated by the measurement circuit, the capture memory having a maximum sustained sampling rate for capturing data and the acquire event generation circuit being operable to generate strobe events for waveform acquisition having event times programmed to a resolution finer than the period of the maximum sustained sampling rate.

27. The apparatus of claim 26, wherein:

the acquire event generation circuit supplies strobe events each having an event time; and the measurement circuit is configured to receive a comparator signal from a pin electronics circuit connected to the terminal of the circuit under test, the measurement circuit being operable to apply a received strobe event at its event time to the comparator signal to generate a corresponding strobe result signal.

28. The apparatus of claim 27, wherein:

the acquire event generation circuit is configured to obtain an acquisition offset value from a programmable register to determine an event time for a strobe event.

29. The apparatus of claim 27, wherein:

the comparator signal comprises an above-comparator-high signal and a below-comparator-low signal;

the received strobe event has an event type; and the value of the corresponding strobe result signal is determined by whether the comparator signal satisfies the event type of the received strobe event.

30. The apparatus of claim 29, wherein:

the signal above-comparator-high is set to have a true value by the pin electronics circuit when the voltage at the terminal of the circuit under test is above a high threshold value;

the signal below-comparator-low is set to have a true value by the pin electronics circuit when the voltage at the terminal of the circuit under test is below a low threshold value; and the high threshold value and the low threshold value are independently programmable values stored in the tester.

31. The apparatus of claim 26, wherein:

the strobe events for waveform acquisition are generated at a maximum rate independent of a test period rate of the test program.

32. The tester of claim 26, comprising:

the apparatus of claim 26 reproduced for each of a plurality of terminals of a circuit under test.

33. The apparatus of claim 26, comprising:

a plurality of acquire event generation circuits each coupled to be coupled to the same terminal of a circuit under test.

34. The tester of claim 33, wherein:

the plurality of acquire event generation circuits are operable to supply a single stream of strobe events for waveforn acquisition to one terminal of a circuit under test.

* * * * *